United States Patent [19]

Sturges

[11] Patent Number: 5,448,525
[45] Date of Patent: Sep. 5, 1995

[54] APPARATUS FOR CONFIGURING A SUBSET OF AN INTEGRATED CIRCUIT HAVING BOUNDARY SCAN CIRCUITRY CONNECTED IN SERIES AND A METHOD THEREOF

[75] Inventor: Jay Sturges, Orangevale, Calif.

[73] Assignee: Intel Corporation, Santa Clara, Calif.

[21] Appl. No.: 208,938

[22] Filed: Mar. 10, 1994

[51] Int. Cl.6 .............................................. G11C 29/00
[52] U.S. Cl. ................................... 365/201; 365/189.12; 365/221; 365/154; 365/185; 371/22.2; 371/22.3
[58] Field of Search ....................... 365/78, 189.12, 201, 365/221, 240, 900, 185, 154; 371/22.1, 22.2, 22.3

[56] References Cited

U.S. PATENT DOCUMENTS

| | | | |
|---|---|---|---|
| 5,132,974 | 7/1992 | Rosales | 371/22.3 |
| 5,239,510 | 8/1993 | Hill | 365/226 |
| 5,278,841 | 1/1994 | Myers | 371/20.6 |
| 5,325,367 | 6/1994 | Dekker et al. | 371/21.1 |
| 5,333,139 | 7/1994 | Sturges | 371/22.3 |
| 5,343,478 | 8/1994 | James et al. | 371/22.3 |
| 5,347,519 | 9/1994 | Cooke et al. | 371/22.2 |
| 5,355,369 | 10/1994 | Greenbergerl et al. | 371/22.3 |

OTHER PUBLICATIONS

"The ABCs of Boundary-Scan Test," Fluke and Philips Test and Measurement Alliance, John Fluke Mfg. Co., Inc., 1991, pp. 6-25.

Primary Examiner—David C. Nelms
Assistant Examiner—Andrew Q. Tran
Attorney, Agent, or Firm—Blakely, Sokoloff, Taylor & Zafman

[57] ABSTRACT

An integrated circuit including a plurality of individual boundary scan circuits each associated with a separate portion of the circuitry of the integrated circuit. The registers of the individual boundary scan circuits are joined to provide a series boundary scan register chain in which individual portions of the circuitry included within the integrated circuit may be individually manipulated.

5 Claims, 5 Drawing Sheets

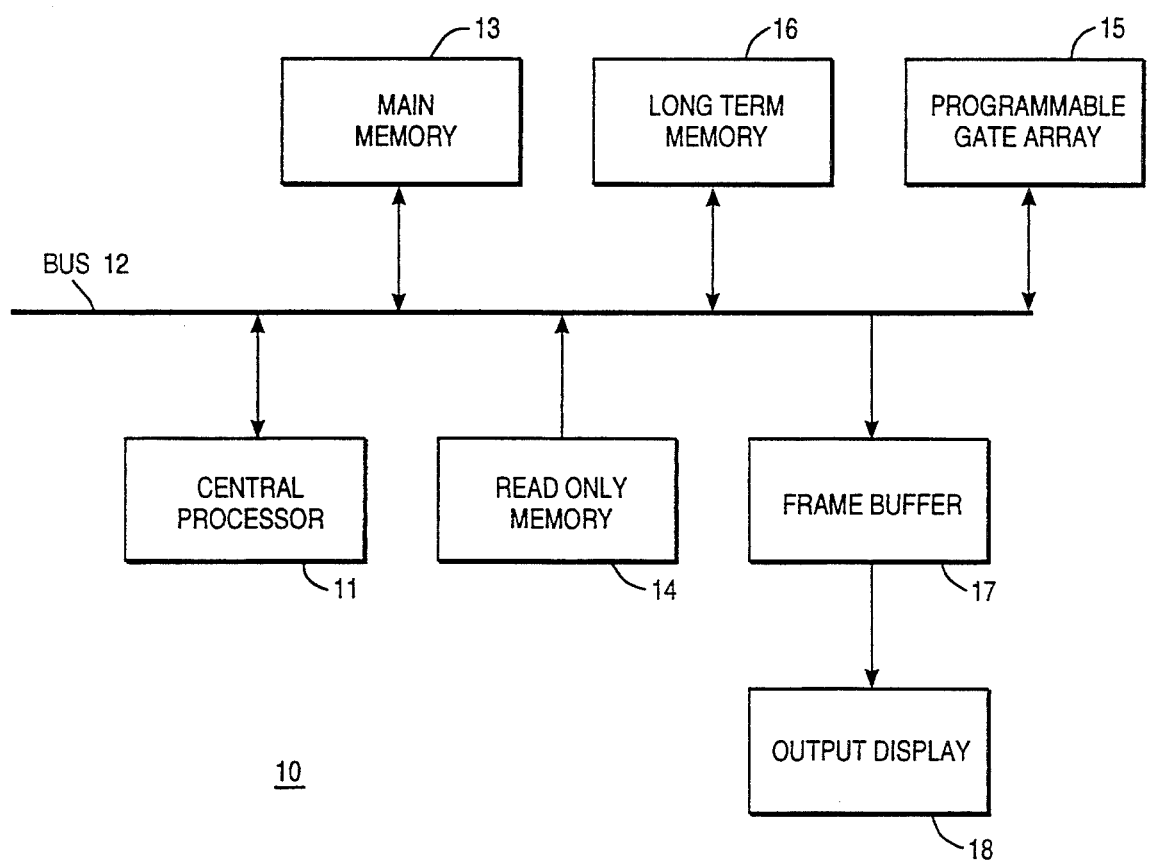
FIG_1
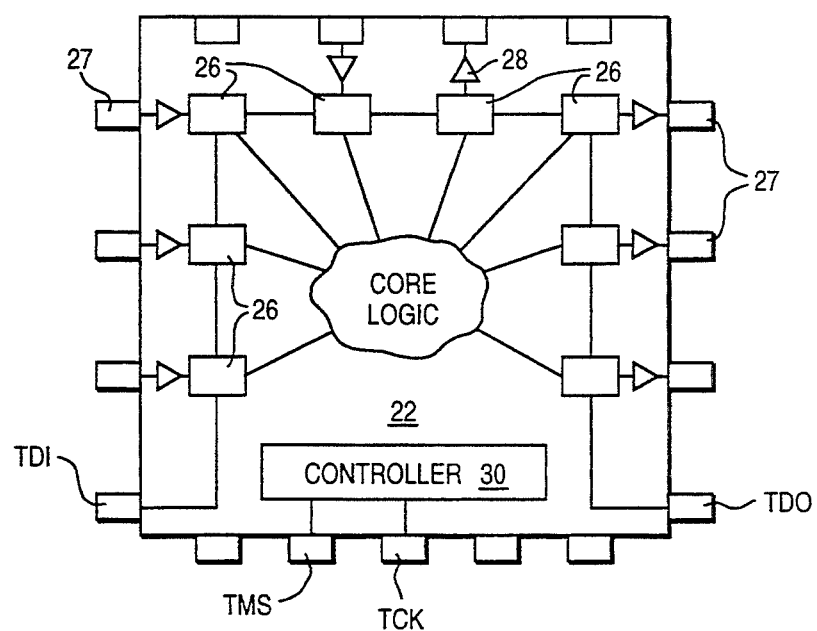
FIG_2

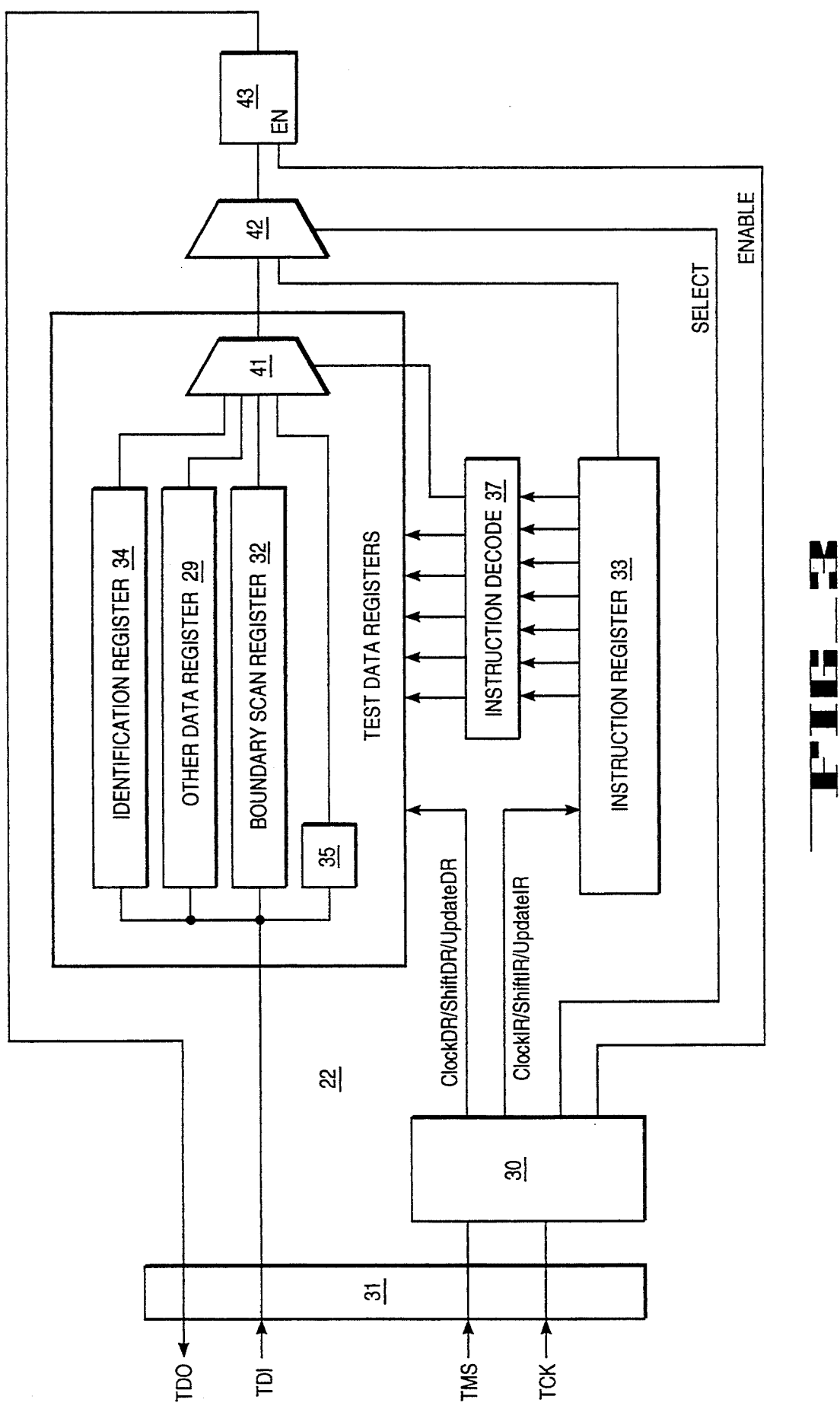
FIG_3

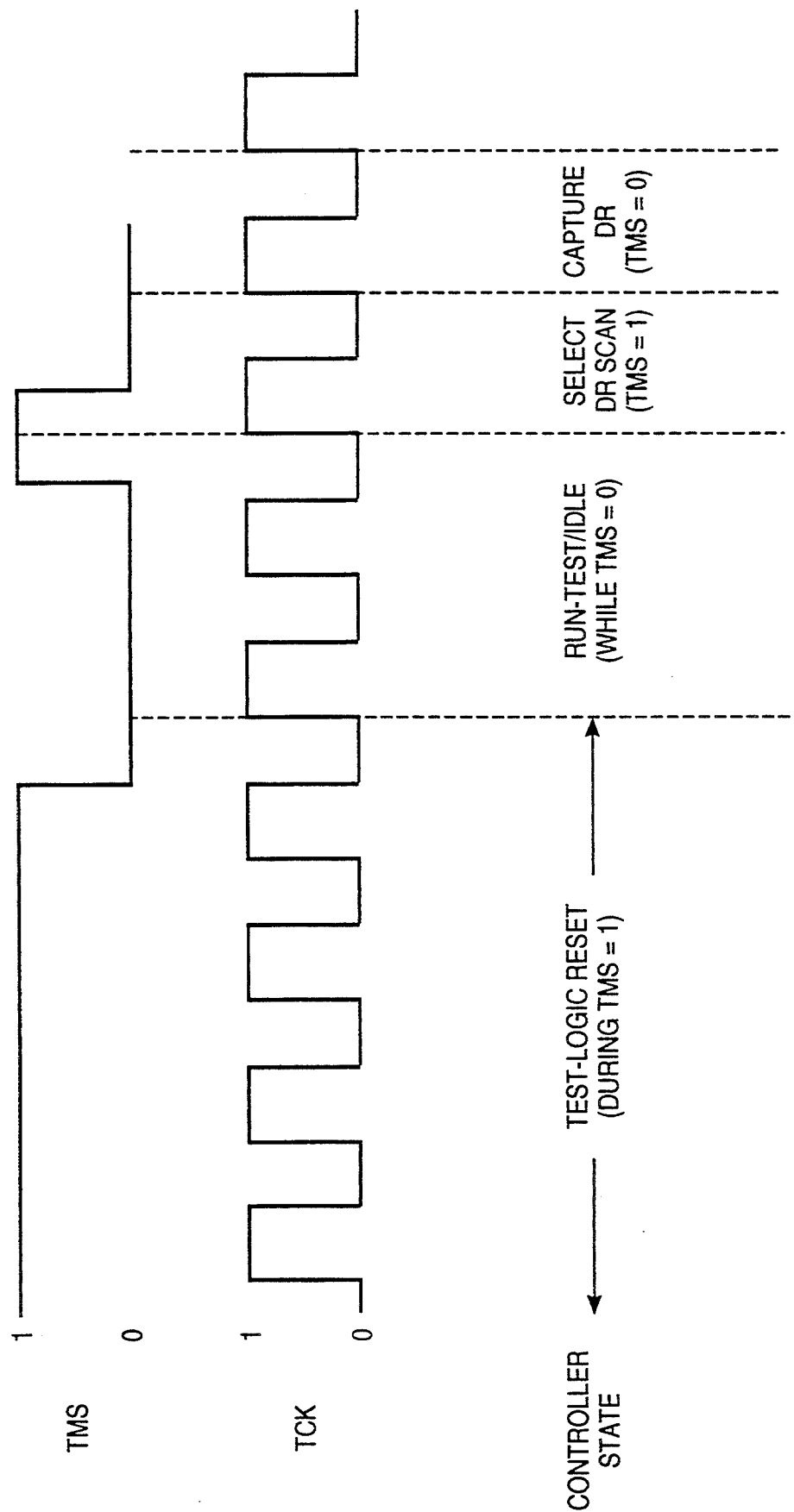

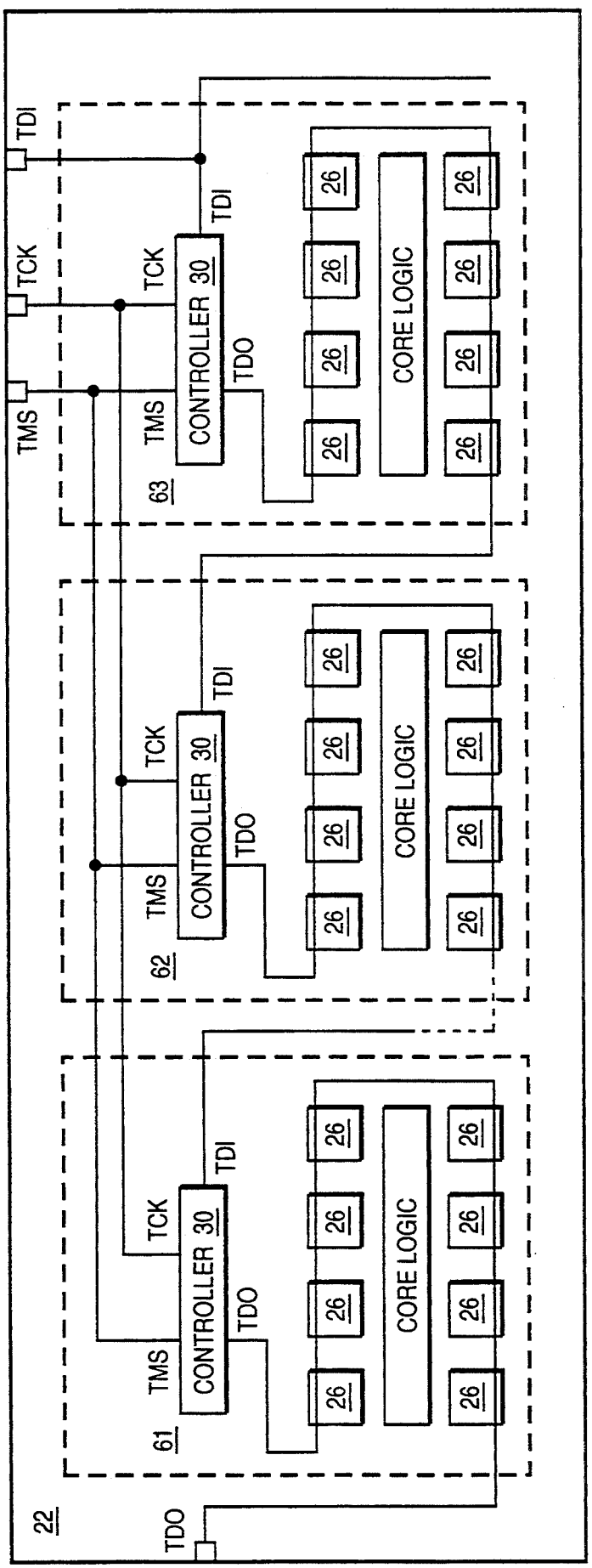
FIG_6

APPARATUS FOR CONFIGURING A SUBSET OF AN INTEGRATED CIRCUIT HAVING BOUNDARY SCAN CIRCUITRY CONNECTED IN SERIES AND A METHOD THEREOF

BACKGROUND OF THE INVENTION

1. Field of the Invention

This invention relates to integrated circuits and, more particularly, to an integrated circuit having a plurality of boundary-scan test circuits connected in a series-linked boundary test scan chain to allow individual portions of the integrated circuit to be individually manipulated and configured.

2. History of the Prior Art

As integrated circuits have become physically smaller while including more and more individual elements, it has become more difficult to test those circuits. In order to assure that such circuits may be tested accurately without inordinate expense, these integrated circuits have been equipped with circuitry adapted to allow boundary-scan testing. Boundary-scan testing uses a plurality of shift register stages built into each integrated circuit. A boundary-scan controller circuit in each integrated circuit controls the transfer of data serially from an input port to an output port through the stages of the boundary-scan shift register and allows use of the data so that circuit testing may be conducted from external terminals without the need for probes and other imprecise instruments. Boundary-scan testing makes the test process for integrated circuits so equipped faster and more accurate.

An industry standard has been implemented for boundary-scan test circuits so that integrated circuits from different manufacturers may be connected in a serial chain within an electronic system. This standard is described in an industry specification, IEEE JTAG 1149.1 ("the Standard"). The Standard provides a protocol by which various test functions may be accomplished through specified test ports defined by the specification. Essentially, the Standard outlines the details of the serial path of linked test registers (called a boundary-scan register chain) through each integrated circuit and defines the properties of the controller for each integrated circuit. The linked serial path of the boundary-scan register chain allows data to be transferred to various test and other registers within any of the integrated circuits. From these registers, various operations may be conducted by the controllers with the specific integrated circuits.

Boundary-scan test circuits offer a number of advantages beyond the ability to rapidly test integrated circuitry. Because it is useful in conducting tests of integrated circuits to read and write to the integrated circuits, one of the operations which it is possible to perform using boundary scan circuitry is writing to memory cells in memory arrays with which the boundary scan circuitry is associated. This offers special advantages with certain circuits. For example, certain memory devices may be placed in a particular condition by writing to the devices. Often the condition of memory devices is used to determine logic operations to be accomplished by associated circuitry. In such a case, such memory devices may be test programmed using the boundary scan circuitry in order to determine the accuracy of a program to be installed to control operations of the associated circuits. For example, certain field programmable gate arrays include various logic circuits which function according to conditions which may be written to static random access memory (SRAM) cells. By varying the conditions of the SRAM cells, different selectable logic functions are provided. Typically, such field programmable gate arrays include other non-volatile memory arrays (in addition to the SRAM cells) such as EPROM or flash EEPROM arrays which provide long term storage for the conditions which are written to the SRAM cells when power is applied to the gate array. These non-volatile memory arrays are not programmed until a correct program providing the desired logic functions has been ascertained because the non-volatile devices, once programmed, cannot be reprogrammed without removal from the system.

Because of the facility to write to memory cells using the boundary scan circuitry, it has become possible to trial program the SRAM devices of such a gate array until correct operation of the logic devices is obtained and then program the non-volatile memory devices with the correct conditions for writing to the SRAM array.

Using prior art boundary scan circuitry, it has been necessary to vary the condition of the memory devices of the SRAM and non-volatile memory arrays to obtain working programs to control the logic operations of the arrays before the field programmable arrays are placed into use. Recently, it has become apparent that it would be very useful if portions of field programmable logic devices could be programmed dynamically so that portions of the logic could be changed in response to changes encountered during operation of the circuitry. In fact, it is desirable to be able to reconfigure portions of a field programmable logic device in response to operation occurring in other operating portions of the field programmable logic device. Prior art boundary scan circuitry cannot conveniently be utilized for this purpose because it is only able to deal with each integrated circuit as a whole.

SUMMARY OF THE INVENTION

It is, therefore, an object of the present invention to provide apparatus and a method for allowing separate portions of an integrated circuit to be individually tested and otherwise manipulated and configured utilizing boundary scan or similar shift register circuitry.

It is a more specific object of the present invention to provide apparatus and a method for programming or writing to individual portions of an integrated circuit without affecting operations in other sections of the integrated circuit.

It is an additional object of the present invention to allow some portions of an integrated circuit to be manipulated and reconfigured while other portions of the integrated circuit are functioning in a normal operating condition.

These and other objects of the present invention are realized in an integrated circuit including a plurality of individual boundary scan or similar shift register circuits each associated with a separate portion of the circuitry of the integrated circuit. The registers of the individual boundary scan circuits are joined to provide a series boundary scan register chain with a plurality of individual controllers within an integrated circuit so that individual portions of the circuitry included within the integrated circuit may be individually manipulated. These and other objects and features of the invention will be better understood by reference to the detailed description which follows taken together with the drawings in which like elements are referred to by like designations throughout the several views.

BRIEF DESCRIPTION OF THE DRAWINGS

FIG. 1 is a block diagram illustrating a computer system which may utilized the arrangement of the present invention.

FIG. 2 is a block diagram illustrating an arrangement of integrated circuits having boundary-scan testing facilities in accordance with the prior art.

FIG. 3 is a block diagram illustrating the boundary-scan circuitry architecture for a particular integrated circuit in accordance with the prior art.

FIG. 5 is a timing diagram illustrating signals utilized in the operation of boundary scan circuitry in accordance with the present invention.

FIG. 6 is a block diagram illustrating an integrated circuit having boundary-scan testing facilities in accordance with the present invention.

NOTATION AND NOMENCLATURE

Figure 4:
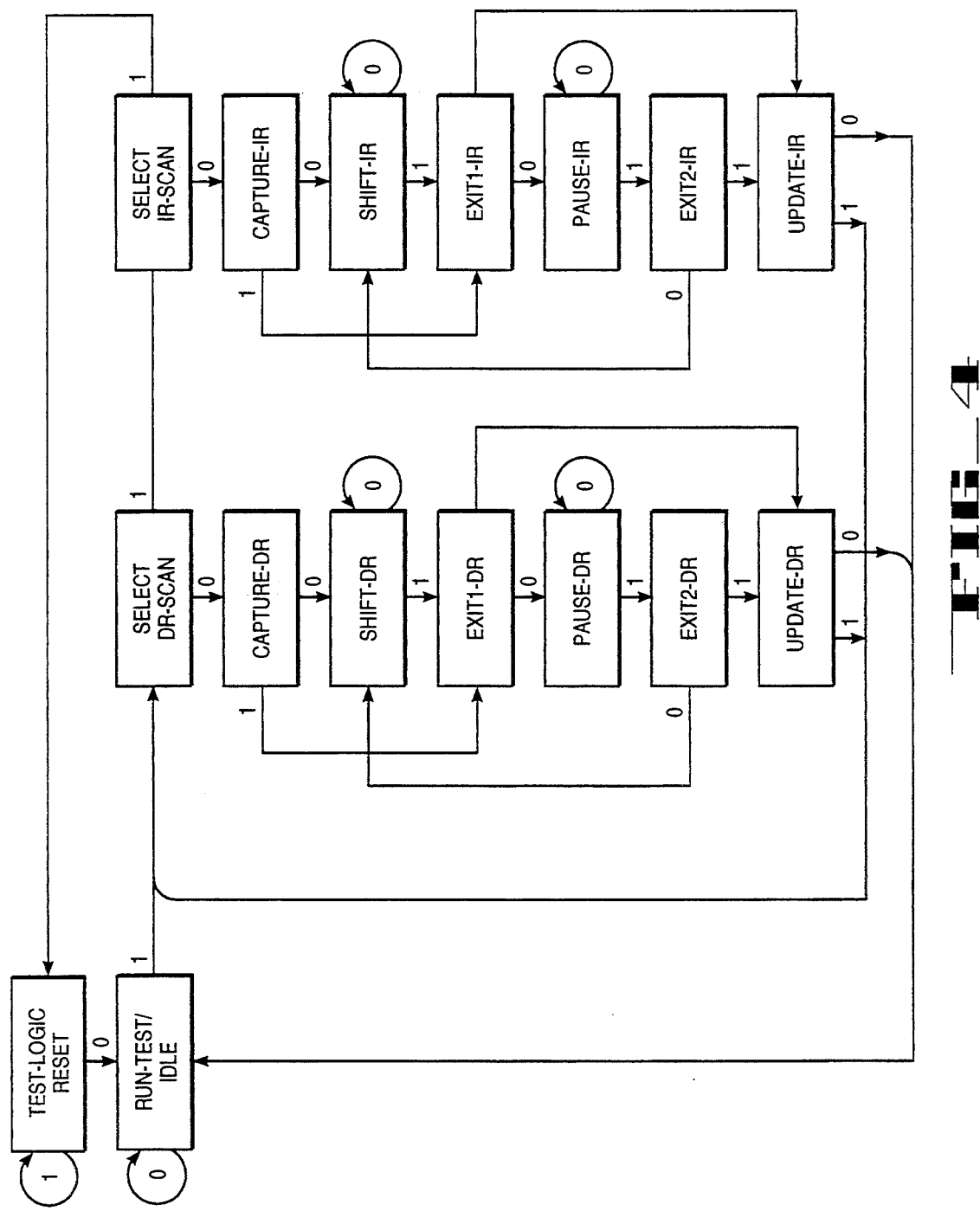
FIG. 4 is a state diagram illustrating the operation of a controller for boundary-scan circuitry illustrated in FIGS. 2 and 3.

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method for operating a computer in processing electrical or other (e.g. mechanical, chemical) physical signals to generate other desired physical signals.

DETAILED DESCRIPTION

Referring now to FIG. 1, there is illustrated a computer system 10. The system 10 includes a central processing unit 11 which executes the various instructions provided to the computer system 10 to control its operations. The central processing unit 11 is joined to a bus 12 adapted to carry information to various components of the system 10. Joined to the bus 12 is main memory 13 which is typically constructed of dynamic random access memory arranged in a manner well known to those skilled in the prior art to store information during a period in which power is provided to the system 10. Also joined to the bus 12 is read only memory 14 which may include various memory devices well known to those skilled in the art each of which is adapted to retain a particular memory condition in the absence of power to the system 10. The read only memory 14 typically stores various basic functions used by the processor 11 such as basic input/output processes and startup processes typically referred to as BIOS processes.

Also connected to the bus 12 are various peripheral components such as long term memory 16 and circuitry such as a frame buffer 17 to which data may be written which is to be transferred to an output device such as a monitor 18 for display. As is well known to those skilled in the art, field programmable gate arrays may be utilized to perform logic functions within any of a number of the circuit components of a computer system such as that illustrated in FIG. 1. One specific use for field programmable gate arrays is to provide the glue logic utilized for joining various components to the bus 12 in a computer system. Another use of such devices is to provide decode logic used for addressing. The circuit 15 is a field programmable gate array such as that described in the present invention. Such a gate array 15 requires various signaling connections well known to those skilled in the art which depend on the particular use of the logic array and are not illustrated in FIG. 1; however, the signals which allow the specific use of the gate array itself are not believe to be important to the understanding of the present invention.

It will be recognized by those skilled in the art that the system 10 illustrated in FIG. 1 might as well represent a system such as an embedded controller. Such a system typically includes elements which perform essentially the same functions as those illustrated differing only in the ease with which the system may be restructured.

FIG. 2 is a block diagram illustrating an integrated circuit 22 which includes a boundary-scan test circuit arrangement designed in accordance with the Standard. The integrated circuit 22 may be mounted on a particular printed circuit board and connected through various conductors (not shown) with additional circuitry adapted to carry out various prescribed functions. For example, the circuit 22 and associated circuits may form some portion of a computer (such as the gate array 15) as described above with respect to FIG. 1. In general, the boundary-scan circuitry is the only portion of the integrated circuit 22 which is illustrated in detail in FIG. 2.

As may be seen, the circuit 22 has four terminals through which signals are transferred to the boundary-scan circuitry. These are a test data in (TDI) terminal, a test data out (TDO) terminal, a test mode select (TMS) terminal, and a test clock (TCK) terminal. These four terminals are typically pins provided at the periphery of each of the integrated circuits and of the printed circuit board on which the integrated circuits reside. Within the circuit 22 are a number of individual boundary-scan cells 26. Each of the boundary-scan cells 26 is functionally one stage of a shift register within that particular integrated circuit. Each boundary-scan cell 26 may be positioned adjacent an external pin 27 on the particular integrated circuit. Data may be provided to or received from a boundary-scan cell 26 at the pin 27 through a buffer stage 28. Each boundary-scan cell 26 may also be connected to provide or accept data from core logic circuitry within the integrated circuit 22.

Thus, the boundary-scan cells 26 of the circuit are joined in a series chain within the particular integrated circuit. One end of the boundary-scan chain of cells 26 formed within the circuit 22 is effectively joined to the TDI terminal for that circuit 22 and the other end of the chain is effectively joined to the TDO terminal of the circuit 22. The TDO terminal of the circuit 22 may be connected to the TDI terminal of a next boundary-scan circuit of a next integrated circuit so that a large serial chain of all of the boundary-scan cells 26 of all of the integrated circuits exists.

The circuit 22 includes a boundary-scan controller circuit 30 which controls the transfer of data through the various stages of the shift register formed by the boundary-scan cells 26 within the circuit 22. The boundary-scan controller circuit 30 of the circuit 22 receives the signals provided at the TMS and the TCK terminals in parallel with other controllers 30 on other integrated circuits which may be connected in a larger chain on a particular circuit board. The boundary-scan controller circuit controls the transfer of instructions and data through the boundary-scan circuitry and the transfer of data between the boundary-scan circuitry and the other circuitry of the circuit 22.

FIG. 3 illustrates the architecture of typical boundary-scan circuitry within the circuit 22 designed in accordance with the Standard. As may be seen, the boundary-scan circuitry includes an input port 31 through which the signals at the TDI, TDO, TMS, and TCK terminals are transferred. The signals at the TDI terminal may be transferred to either the boundary-scan register 32 defined by the boundary-scan cells 26, to some other data register 29, or to an instruction register 33 under control of the signals appearing the TMS terminal. In particular integrated circuits, the other register 29 may include a number of additional registers. Especially pertinent to the present operation are other registers 29 which may be used for to hold data to be written to memory cells of memory arrays which are a portion of the core circuitry with which the boundary scan circuitry is associated. Also connected in parallel with the aforementioned registers is a device identification (ID) register 34 which may contain a twelve bit value identifying the particular integrated circuit; where no identification number is provided, a single stage register storing a zero value is provided instead. As will be understood, the boundary-scan register 32, the instruction register 33, and any other registers 29 (not including the identification register 34 which is always twelve bits in length) connected in parallel therewith may be of any length depending on the number of boundary-scan stages within the circuit 22 and the size of instructions affecting that circuit. Consequently, a one bit bypass register 35 is provided to allow a one clock bypass of the particular boundary-scan circuitry of the circuit 22 when the testing operation is not directed to the circuit 22. Each of these different registers provides in effect a selectable shift register path though the boundary scan circuitry of the particular integrated circuit.

An instruction placed in the instruction register 33 is decoded by an instruction decode circuit 37 and controls the transfer of data through the boundary-scan circuitry. The signals on the TMS and TCK terminals are transferred to the boundary-scan controller circuit 30 which provides control signals in accordance with the state diagram of FIG. 4 to control the operation of the boundary-scan circuitry.

As may be seen, the instruction controls the operation of a multiplexor 41 which controls the data path taken through the particular portion of the boundary-scan circuitry. Control signals from the boundary-scan controller circuit 30 also control a second multiplexor 42 which selects data from the path through the instruction register 33 or the data registers 29, 32, 34, and 35. A gate 43 is enabled when the test function of the boundary-scan circuitry is enabled by the TMS signals to allow data to flow to the TDO terminal. Thus, as may be seen, a serial path is provided through the boundary-scan circuitry of the circuit 22. Data may be transferred bit by bit through this serial path from the TDI terminal to the TDO terminal. By providing a selected sequence of control signals at the TMS terminal to place the controller 30 in a desired state, a path may be selectively provided through the instruction register 33, the boundary-scan register 32, the identification register 34, or the test data register or other registers 29. When the TDO terminal of one integrated circuit is connected to the TDI terminal of the next integrated circuit, a selectable serial path exists from the input terminal TDI on the printed circuit board through the boundary-scan circuitry of all integrated circuits to the TDO terminal on the printed circuit board.

FIG. 4 is a state diagram defining the operation of the boundary-scan controller circuit 30 of the circuit 22 in accordance with the Standard. FIG. 5 is a timing diagram illustrating signals provided to the controller circuit 30. In a typical arrangement, the boundary-scan controller circuit 30 is a finite state machine which operates synchronously with the clock input signals TCK. All state transitions within the boundary-scan controller circuit 30 occur at the rising edge of the TCK pulse while actions in the registers and other test logic occur at either the rising or the falling edge of the TCK.

If the boundary-scan controller circuit 30 is in the Test-Logic Reset state, as long as the TMS signal is held at one, the boundary-scan controller circuit 30 remains in that state; in this state, all test logic is disabled. In this state, the path through the bypass register 35 of the boundary-scan circuit is enabled and the values in the instruction register 33 are reset to zero. If the TMS signal is then set to zero, the boundary-scan controller circuit 30 leaves the Test-Logic Reset state at the rising edge of the next TCK pulse and enters the Run-Test/Idle state; while the boundary-scan controller circuit 30 remains in this state, various tests may be run or instructions performed depending on the instruction value in the instruction register 33. The boundary-scan controller circuit 30 remains in the Run-Test/Idle state so long as the TMS signal is zero, but leaves that state on the rising edge of a TCK signal for a Select DR-Scan state when the TMS signal becomes a one. The boundary-scan controller circuit 30 remains in this state for only one clock interval since a TMS value of one sends it to a Select IR-Scan state while a zero sends it to a Capture-DR state. The Select DR-Scan and Select IR-Scan states are used to control the route to be followed through the state machine of the boundary-scan circuit controller 30.

If the boundary-scan controller circuit 30 is in the Capture-DR state, data may be loaded in parallel from the selected parallel input pins 37 into the shift register stages of a selected data register (e.g., 29 or 32). A TMS value of one causes the boundary-scan controller circuit 30 to shift to an Exit 1-DR state. A TMS value of zero causes the boundary-scan controller circuit 30 to shift to a Shift-DR state. In the Shift-DR state, any data is shifted out to the TDO terminal by one shift register stage on the rising edge of each TCK clock signal. In the Shift-DR state, the path through the identification registers 34 of each integrated circuit is automatically selected. It should be noted that if no identification register is provided, the path selected is through the one stage register which substituted in its place. A TMS value of one causes the boundary-scan controller circuit 30 to move to the Exit 1-DR state. The Exit 1-DR state, like the Select DR-Scan and Select IR-Scan states, is used to control the route to be followed through the boundary-scan controller state machine. From the Exit1-DR state, the boundary-scan controller circuit 30 moves to a Pause-DR state on a TMS value of zero where it may reside during the continuation of the zero TMS value; this state provides a temporary pause in the shifting process. A TMS value of one moves the boundary-scan controller circuit 30 to an Exit2-DR state; the Exit2-DR state is also used to control the route to be followed the boundary-scan controller state machine. A TMS value of zero at the Exit2-DR state moves the boundary-scan controller circuit 30 back to the Shift-DR state while a TMS value of one moves the boundary-scan controller circuit 30 to an Update-DR state. The boundary-scan controller circuit 30 also moves to the Update-DR state from the Exit 1-DR state in response to a one TMS value.

At the Update-DR state, the data in any data register may be provided to a latched parallel output in the core logic of the particular integrated circuit 22. This allows the data to be transferred from the boundary-scan circuitry to the core logic of the integrated circuit without being affected by the shifting of the boundary-scan chain.

As will be appreciated, the transfer of instruction data through the states (Capture IR, Shift IR, Exit1 IR, Pause IR, Exit2 IR, and Update IR) succeeding the Select IR-Scan state proceeds in a manner essentially identical to that described for the data path.

As is well known, instructions and data may be furnished in serial binary form at the TDI terminal of a printed circuit board and transferred to any particular register in an integrated circuit by appropriate selection of the sequence of TMS signals. An instruction transferred to the instruction register 33 may be utilized to control data similarly furnished at the TDI terminal and transferred to a boundary-scan register 32 or another one of the data registers. An example of the operation for a particular boundary-scan controller circuit 30 follows.

The TMS signal is first set to one for a select period (e.g., five clocks) to transfer the controller 30 to the Test-Logic Reset state. In this state, the path through the boundary-scan circuit is set to the bypass registers 35; and the instruction registers are all cleared to zero. If the TMS signal is then set to a zero, the boundary-scan controller circuit 30 moves from the Test-Logic Reset state to the Run-Test/Idle state on the next clock. If in the Run-Test/Idle state the TMS signal remains a one, the boundary-scan controller circuit 30 moves to the Select DR state on the next clock. The Select-DR state allows the state machine to move to a path in which the various test registers are utilized. If the TMS signal is changed to a zero, the boundary-scan controller circuit 30 moves to the Capture-DR state on the next clock. If the TMS signal then changes to a zero, the boundary-scan controller circuit 30 moves to the Shift-DR state on the next clock. If the TMS signal then changes to a zero, the boundary-scan controller circuit 30 remains in the Shift-DR state on the next clock and shifts in the data at the TDI terminal toward the TDO terminal so long as the TMS signal remains at zero. In this state, the identification registers 34 are automatically selected. In this state any serial string of data placed at the TDI terminal will be shifted through the boundary-scan chain toward the TDO terminal including particularly the identification registers 34. For those circuits which have identification numbers, the traverse of the twelve bit register requires twelve clock periods; while for those circuit which do not have identification numbers, the traverse of the single bit register requires only one clock period.

If, when the state machine is in the Select DR-Scan state, the TMS signal remains a one rather than changing to zero, the boundary-scan controller circuit 30 moves to the Select IR-Scan state on the next clock. If the TMS signal then changes to a zero, the boundary-scan controller circuit 30 moves to the Capture-IR state on the next clock. If the TMS signal then changes to a zero, the boundary-scan controller circuit 30 moves to the Shift-IR state on the next clock. In this state, the instruction register 33 of the boundary-scan circuit is automatically selected to provide the path through the boundary-scan chain. If the TMS signal changes to a zero, the boundary-scan controller circuit 30 remains in the Shift-IR state on the next clock and shifts any data provided at the TDI terminal one bit per clock (so long as the TMS signal remains at zero) toward the TDO terminal through a path which includes the instruction registers 33. This ultimately shifts the data to positions in the instruction register 33 so that it may be utilized as an instruction. Rather than placing data in a register for use, the data may be simply shifted through the boundary-scan circuitry of an integrated circuit out of the TDO terminal to the TDI terminal of the next integrated circuit. As may be seen, the ability to selectively move data through the boundary-scan circuitry in response to a particular sequence of TMS signals allows data to be placed in any register in the boundary-scan circuitry of an integrated circuit.

As may be understood from the foregoing discussion, it is entirely possible to use the circuitry of a boundary-scan chain in order to write to and to read from memory cells which are a part of the core logic of the integrated circuit with which the boundary scan circuitry is associated. This is particularly useful with certain types of circuitry such as field programmable gate arrays. The ability to write to the memory cells of these gate arrays allows the memory cells of the gate arrays to be test programmed in order to determine the accuracy of a program to be installed to control array operations. As was pointed out above, certain field programmable gate arrays include on a single integrated circuit a large number of gates which function according to conditions which may be written to an array of SRAM cells to perform selectable logic functions. By varying the conditions of the SRAM cells, the gates are made to perform different logic functions. Typically, such field programmable arrays include, in addition to the SRAM arrays, additional non-volatile memory arrays which provide storage for the conditions which are written to the SRAM cells when power is applied to the array, These non-volatile memory arrays are not be programmed until a correct program has been devised and tested because, at least where EPROM devices are used, the non-volatile devices often cannot be reprogrammed without inordinate effort requiring at least removal from the system.

Using the boundary-scan circuitry, a SRAM array may be programmed and tested under operating conditions. The program may be changed as often as necessary until an error-free result is obtained. When a correct program has been tested, the integrated circuit is turned off; and the non-volatile portion of the integrated circuit is programmed with the tested program.

Recently, it has become apparent that it would be very useful if individual portions of field programable logic devices could be programmed dynamically so that portions of the logic could be changed in response to changes encountered during operation of the circuitry. In fact, it is desirable to be able to reconfigure portions of a field programmable logic device in response to operation occurring in other operating portions of the field programmable logic device. Thus, the logic of a particular portion of an integrated circuit field programmable device might provide a result consisting of output signals which might be utilized to program on the fly memory arrays controlling other portions of the same integrated circuit field programmable logic device. Prior art boundary scan circuitry cannot conveniently be utilized for this purpose because it is only able to deal with each integrated circuit as a whole.

Apparatus and a method have now been devised by which the boundary scan circuitry of an individual integrated circuit may be made to control the manipulation of other individual portions of the integrated circuit. This improved boundary scan circuitry may be utilized in a number of different ways to provide very advantageous results. For example, portions of the integrated circuit may be tested and otherwise manipulated without regard to the other portions of the integrated circuit. Because individual portions of the integrated circuit may be manipulated and configured individually, some portions of the integrated circuit may be performing normal operations while other portions are being independently manipulated uses the boundary scan circuitry. These allows portions of a field programable integrated circuit logic device which are functioning in a normal operation to provide results which may be used to write to or program memory arrays of other portions of the integrated circuit logic device. In effect, if the non-volatile memory devices are devices such as flash EEPROM devices which may be programmed in place, then a field programable integrated circuit logic device may be made to become self programable so that it may vary its logic as it operates. This is especially useful in such devices used as a part of embedded controllers in, for example, networking systems or in other circuitry which may advantageously learn as it operates.

FIG. 6 illustrates apparatus in accordance with the present invention. The figure illustrates an integrated circuit 22 including core logic which is separated into a plurality of individual portions only three portions 61, 62, and 63 of which are illustrated. Each of these portions has associated with it a controller 30 and a chain of boundary scan registers 26. Each of the boundary scan controllers 30 may be designed in accordance with the circuitry illustrated above in FIG. 3. The three portions of circuitry 61–63 are in the preferred embodiment are selected to be portions for which individual manipulation using the boundary scan circuitry is desirable. For example, one of the portions may be associated with a first SRAM memory array which stores conditions controlling the operation of the gating circuits and with a first nonvolatile memory array including flash EEPROM memory cells which may store conditions controlling the states of the cells of the first SRAM memory array when power is applied to the circuit. Another portion may be associated with a second SRAM memory array which stores conditions controlling the operation of the gating circuits and with a second nonvolatile memory array which may store conditions controlling the states of the cells of the second SRAM memory array. In a like manner, another portion may be associated with a third portion of SRAM memory array and a third portion of non-volatile memory array in the gate array.

Each of the boundary scan controllers includes the normal terminals for connecting to other portions of the electronic system including the TMS, TDI, TDO, and TCK terminals. The TDO terminal of the first of the portions is joined to the TDI terminal of the next of the portions. In a similar manner, the TDO terminal of the second of the portions is joined to the TDI terminal of the next portion. This may continue for as many individual portions as there are in the core circuitry of the individual integrated circuit for which individual manipulation by the boundary scan circuitry is desirable. In this manner, a series of independent boundary scan controller areas each with its own boundary scan register chain is provided within the integrated circuit. Thus, a first portion of the boundary scan circuitry may, for example, be associated with SRAM memory devices and non-volatile memory devices which are functioning as a portion of a field programmable gate array during normal operating conditions. Another second portion of the boundary scan circuitry may be associated with SRAM memory devices and non-volatile memory devices which is another portion of the same field programmable gate array but is not operating but is instead being programmed by data provided by the operations of the portion of the gate array controlled by the first portion of the boundary scan circuitry. In such an arrangement, the memory devices configured by the second portion are, in effect, capable of being programmed on the fly in response to the output signals produced by gate array manipulated by the first portion. Of course, such an operation is not necessary to the arrangement provided by the present invention. A first portion of a field programable device may be operating under normal conditions while a second or third portion is being programmed by its independently operable boundary scan circuitry. Alternatively, all of the portions of the boundary scan circuitry may be operated together to test or otherwise manipulate the associated core circuitry.

Many other uses for a series of independent boundary scan chains within a single integrated circuit will be apparent to those skilled in the art. Depending on the particular associated core circuitry, there may be many reason for independently utilizing one portion of a boundary scan chain without affecting other portions. Those skilled in the art will devise others uses within the scope of the present invention.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. An integrated circuit comprising:
a plurality of portions of circuitry located on a substrate, coupled together, each portion of circuitry capable of separately operating;
a plurality of test devices located on the substrate each test device coupled to a different portion of circuitry of the plurality of portions of circuitry, each test device comprising;
    a controller for receiving as input a data signal, clock signal and command signal and selectively outputting data signals; and
    a plurality of shift registers coupled to the controller, each shift register having a data input and output, the movement of data through the shift registers controlled by the controller, said plurality of shift registers further serially coupled together such that the output of a preceding shift register of the plurality of shift registers is selectively coupled to an input of a subsequent shift register of the plurality of shift registers, each of said plurality of shift registers further selectively coupled to the portion of circuitry such that data is selectively written to or read from the portion of circuitry under control of the controller, and when data is selectively written to the portion of circuitry, said portion of circuitry is operable in a mode other than a normal operating mode;
each test device serially coupled together such that the output of a last shift register of the serially coupled plurality of shift registers of a preceding test device is coupled to the controller data input of a subsequent test device;
wherein within a single integrated circuit on a single substrate a first portion of circuitry operating in said normal operating mode while a second portion of circuitry is read from or written to by a coupled test device.

2. The integrated circuit as set forth in claim 1, wherein the circuitry comprises a field programmable gate array.

3. The integrated circuit as set forth in claim 1, wherein the circuitry comprises a field programmable gate array having a plurality of gates, a plurality of static random access memory (SRAM) cells for controlling the operation of the gates and a plurality of nonvolatile memory cells for controlling the condition of the SRAM cells.

4. The integrated circuit as set forth in claim 3, wherein each test device is coupled to a portion of the plurality of SRAM cells such that a first portion of said SRAM cells can be read from or written to by the test device while a second portion of said SRAM cells controls a portion of the plurality of gates of the field programmable gate array.

5. A method for dynamically reconfiguring the operations of gates of a field programmable gate array (FPGA) on a substrate, said FPGA comprising the gates, a plurality of static random access memory (SRAM) cells for controlling the operation of the gates, and a plurality of nonvolatile memory cells for controlling the condition of the SRAM cells, said method comprising the steps of:
providing on the substrate a plurality of boundary scan circuits, each boundary scan circuit of the plurality of boundary scan circuits coupled to a different portion of SRAM cells;
determining an output in response to conditions of gates associated with a first portion of SRAM cells;
configuring a second portion of SRAM cells using the coupled boundary scan circuit in response to the output determined in response to the conditions of the gates associated with said first portion of SRAM cells.

* * * * *